United States Patent [19]

Zakel et al.

[11] Patent Number: 5,989,993
[45] Date of Patent: Nov. 23, 1999

[54] METHOD FOR GALVANIC FORMING OF BONDING PADS

[75] Inventors: Elke Zakel, Reinickestrasse 8, 14612 Falkensee; Rolf Aschenbrenner, Berlin; Andreas Ostmann, Berlin; Paul Kasulke, Berlin, all of Germany

[73] Assignees: Elke Zakel; Pac Tech Packaging Technologies, GmbH, both of Germany

[21] Appl. No.: 08/636,163

[22] Filed: Apr. 22, 1996

[30] Foreign Application Priority Data

Feb. 12, 1996 [WO] WIPO ............... PCT/DE96/00206

[51] Int. Cl.⁶ .................. H01L 21/288; H01L 21/60
[52] U.S. Cl. .................. 438/614; 438/678; 438/615; 438/653; 438/654; 438/686; 438/687; 438/688
[58] Field of Search .................. 438/678, FOR 389, 438/614, 615, 653, 654, 686, 687, 688, FOR 343; 427/98, 305

[56] References Cited

U.S. PATENT DOCUMENTS

| | | |
|---|---|---|
| 3,599,060 | 8/1971 | Triggs et al. . |
| 4,182,781 | 1/1980 | Hooper et al. . |
| 4,910,072 | 3/1990 | Morgan et al. . |
| 4,970,571 | 11/1990 | Yamakawa et al. . |
| 5,169,680 | 12/1992 | Ting et al. . |
| 5,384,284 | 1/1995 | Doan et al. ............ 437/190 |
| 5,508,228 | 4/1996 | Nolan et al. . |
| 5,532,025 | 7/1996 | Kinlen et al. . |
| 5,583,073 | 12/1996 | Lin et al. . |
| 5,587,337 | 12/1996 | Idaka et al. . |

FOREIGN PATENT DOCUMENTS

| | | |
|---|---|---|
| 0176746 | 4/1986 | European Pat. Off. . |
| 3702354 | 7/1987 | Germany . |
| 4226167 | 2/1994 | Germany . |
| 4424014 | 1/1996 | Germany . |
| 117450 | 1/1989 | Japan . |
| 22132 | 1/1990 | Japan . |
| 2224335 | 9/1990 | Japan . |
| 2276249 | 11/1990 | Japan . |
| 3012933 | 1/1991 | Japan . |
| 3209725 | 9/1991 | Japan . |
| 4022131 | 1/1992 | Japan . |
| 4094544 | 3/1992 | Japan . |
| 5109734 | 4/1993 | Japan . |
| 6140409 | 5/1994 | Japan . |
| WO9602122 | 1/1996 | WIPO . |

OTHER PUBLICATIONS

Ting et al., Selective Electroless Metal Deposition for Integrated Circuit Fabrication, J. Electrochem. Soc. vol. 136, No. 2, pp. 456–462, Feb. 1989.
Activation of Surface by STM Probe Electroless Plating, IBM Technical Disclosure Bulletin, vol. 31, No. 9, p. 241, Feb. 1989.
Thomas et al., Vapor Phase Deposition of Palladium for Electroless Copper Plating J. Electrochem. Soc. vol. 136, No. 6, pp. 1661–1666, Jun. 1989.
Elbing et al., Jahrbuch Oberflächentechnik Band 49, 1993, p. 107ff.
Ashenbrenner et al., Electroless Nickel/Copper Plating as a New Metallization, IEEE Transactions on Components, Packaging, and Manufacturing Technology Part–B, vol. 18, No. 2, May 1984, pp. 334–338.
Lee et al., Structure and Corrosion Characteristics of Electroless Ni–Mo–P Alloy Deposits, Plating and Surface Finishing, Sep. 1991.
Riedel, Funktionelle Chemische Vernicklung, Berlin 1989, p. 13ff.
Nachbehandlung Von Chemisch Abgeschiedenen Nickelüberzügen, Thermische Nachbehandlung, p. 192ff.

*Primary Examiner*—David Graybill
*Attorney, Agent, or Firm*—Eckert Seamans Cherin & Mellott, LLC

[57] ABSTRACT

Method for the preparation of electrodeposited or galvanically deposited bumps for the bonding of integrated circuits, characterized by two subsequent metal depositions, deposited without an external current source (chemical metal deposition) on a metallization 1, the first deposition being thicker than the second and the second deposition being more even or more regular throughout a large area than the first one.

14 Claims, 2 Drawing Sheets

METHOD FOR GALVANIC FORMING OF BONDING PADS

BACKGROUND OF THE INVENTION

1. Field of the Invention

The present invention relates to a process for the preparation of bumps on integrated circuits (ICs). The object is to avoid an (expensive) sputtering process required for the preparation of prior art bumps.

2. Prior Art

The flip-chip—or Tape Automated Bonding (TAB)—technology is a bonding process interconnecting the chip via "bumps" with a printed or prepared circuit structure on (semiconductor-) substrates. These processes allow high connection rates on a very small surface, lower inductivities as compared with wire bondings and an improved transfer of heat or thermal conveyance. At present, solder bumps or gold bumps are commonly used in said flip-chip and TAB technology. These processes require entire wafers as well as the use of thin-film-technologies (sputtering, photoresist-structuring) in combination with galvanic metal deposition processes.

Wafers comprising aluminum bond pads and a passivation layer are used for the galvanic shaping or molding of bumps in photosensitive resist. The passivation layer covers the entire wafer—thus sufficiently protecting the active elements—only the aluminum bond pads are left open and are overlapped on the edges by the passivation. The bumps may not be deposited directly on said aluminum pads, because metallic interconnections are formed at the surfaces adjoining the aluminum. Therefore, an adhesion and diffusion barrier layer (e. g. TiW) is prepared by sputtering after a preceding sputtering and etching process. A second thin gold or copper layer is sputtered, to form a basis for the gold or solder bumps to be deposited by galvanization. Said layer system is also called "under-bump-metallization". A galvanic mask consisting of photosensitive resist is required for the preparation of the bumps. In order to obtain a high contact density, the horizontal growth may be limited by using a thick photosensitive resist. The galvanic shaping of the bumps is effected in a respective metal bath.

SUMMARY OF THE INVENTION

The present invention relates to a process for the deposition of a metallic under-bump-metallization and plating base for bumps to be shaped by galvanization, said process being effected by a metal deposition without outer or external current source (chemical metal deposition). The inventive process avoids the expensive sputtering process and reduces the cost for the "bumping". Metal plating or deposition processes without external current source are less expensive and surprisingly achieve a comparable quality of the bumps without having to accept an undesirable diffusion in the bump basis area.

In ideal circumstances, this kind of layered systems comprising an under-bump-metallization and a plating base achieves the following characteristics:

- The diffusion of gold or solder through the under-bump-metallization to the aluminum and vice versa is blocked.
- The conductivity of the plating base is high and the contact resistances to the adjoining layers are low.
- The mechanical requirements, such as good adhesive effect and resistibility to mechanical and thermal stresses are satisfied.
- The thermal conductivity is high.
- The thickness and structure of the layer are regular (even) throughout the entire wafer surface.

The invention is described in detail on the basis of two embodiments, however not to be regarded as limiting the scope of the invention.

DETAILED DESCRIPTION OF THE PREFERRED EMBODIMENTS

In the Figures, an aluminum bond pad 1 is applied to a substrate 3 which may be a semiconductor type (Si, Ge) or a PCB (printed circuit board) comprising several conductive paths to form a connector for bonded chips. A passivation 2 is deposited on the edges of said aluminum basis 1, where it arches or vaults slightly. The passivation covers—with the exception of the aluminum pads 1—the surface of the substrate 3.

Figure 1A:
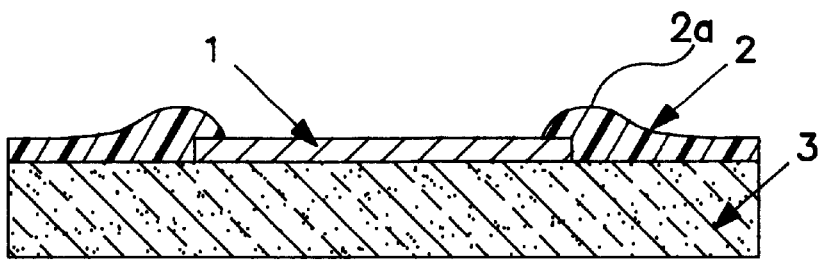
FIGS. 1a to 1e schematically show a first process flow A as first embodiment of a galvanic bump forming.
Figure 1B:
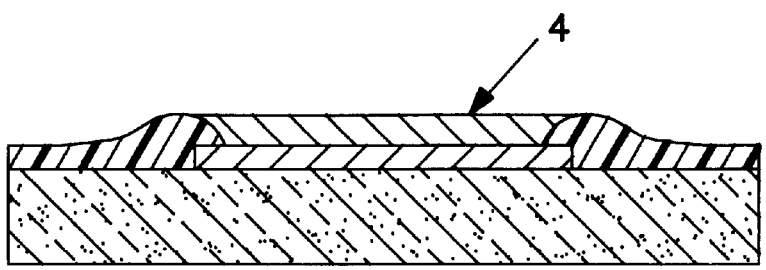
Figure 1D:
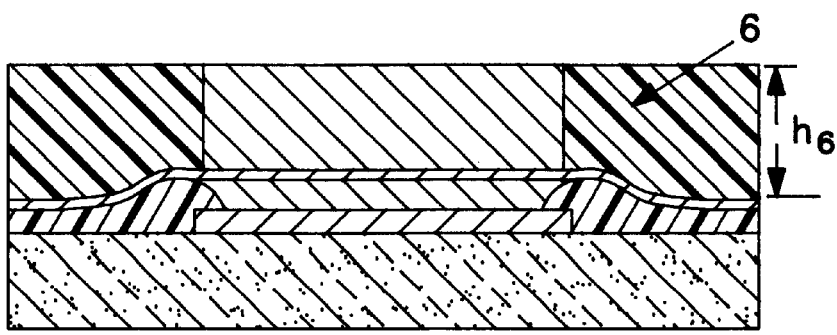
Figure 1E:
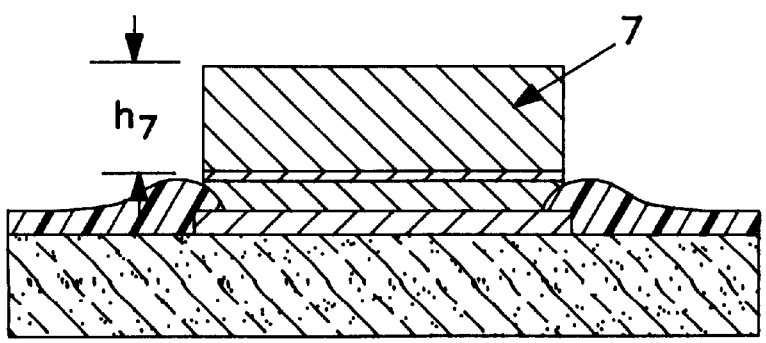
Figure 2A:
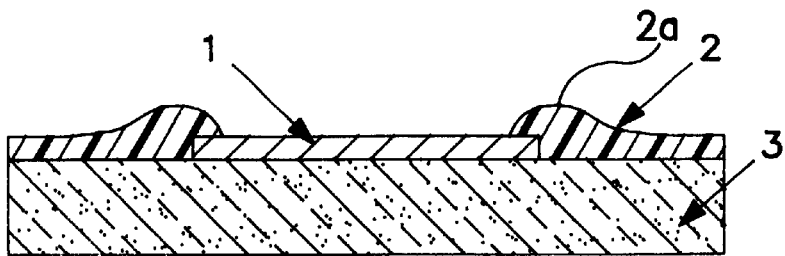
FIGS. 2a to 2f schematically show a second process flow B as second embodiment of a galvanic bump forming.
Figure 2B:
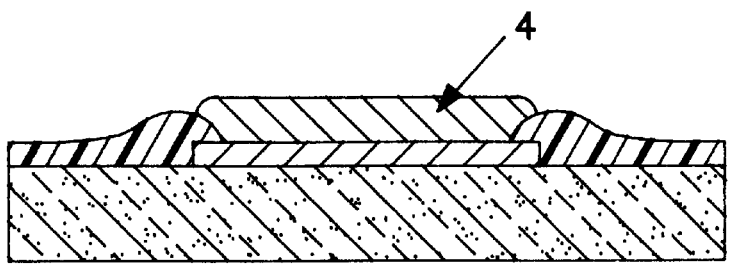

Said aluminum basis 1 is coated with a metallization being comparable in its thickness and consisting preferably of nickel, so that a conductive interconnection between basis 1 and metallization 4 is provided. The thickness or height of said metallization 4 is provided to achieve approximately the height or level of the edge curvature 2a of said passivation layer 2 or to exceed it distinctly to substantially (compare FIG. 1b and FIG. 2b). Said metallization 4 is coated with a conductive layer (plating base) 5 being thin with respect to said metallization 4 or said aluminum bond pad 1. A considerably higher metal bump 7, forming the contact bump, is applied to said plating base 5 in the area of said metallization 4 onto said bond pad 4,1. The application is effected by galvanic deposition, which is controlled by openings of a surrounding very thick photosensitive resist 6. Said bump 7 is deposited from a galvanic bath in said openings or windows 6a (cf. FIG. 2e or 1d).

After removal of said photosensitive resist 6, said bump 7 remains protruding on said substrate 3, on top of said plating base 5, said metallization 4 and said aluminum bond pad 1.

Outside of or around said bump 7, said plating base 5 may be removed, e. g. by etching.

Figure 1C:
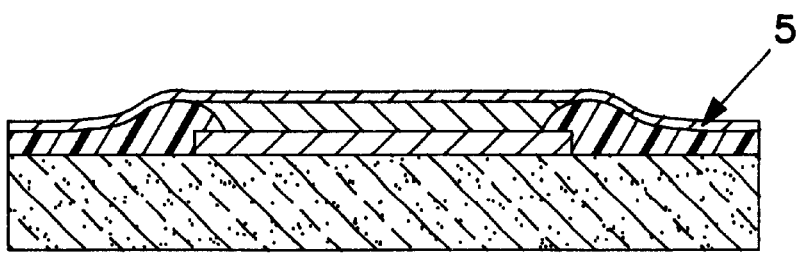
Figure 2C:
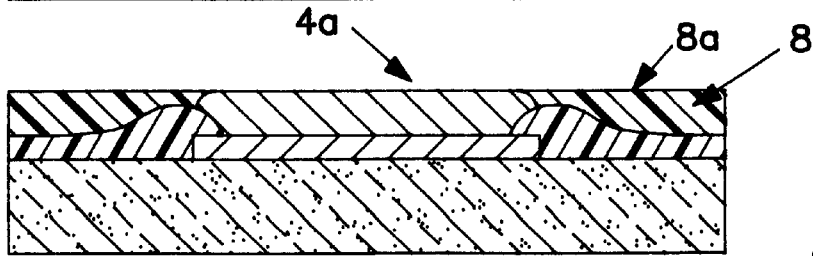
Figure 2D:
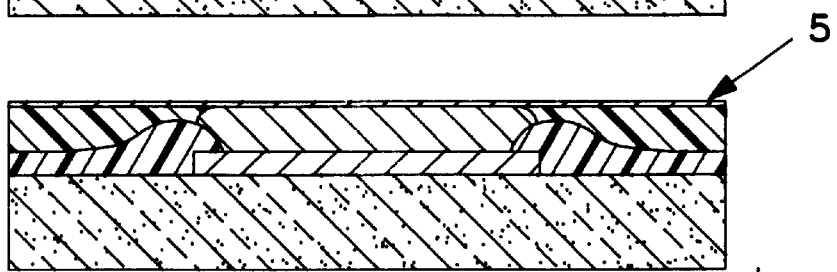
Figure 2E:
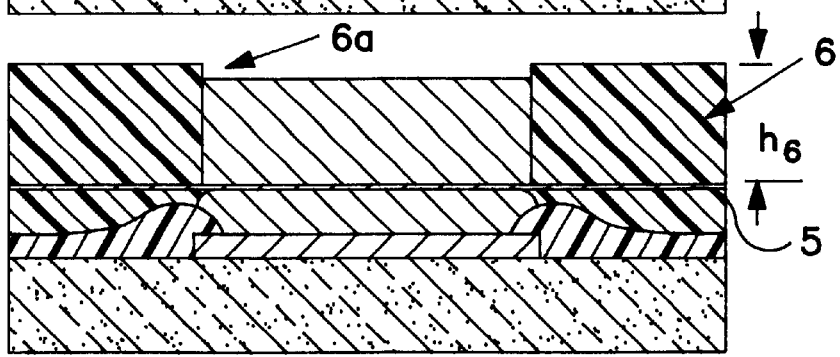
Figure 2F:
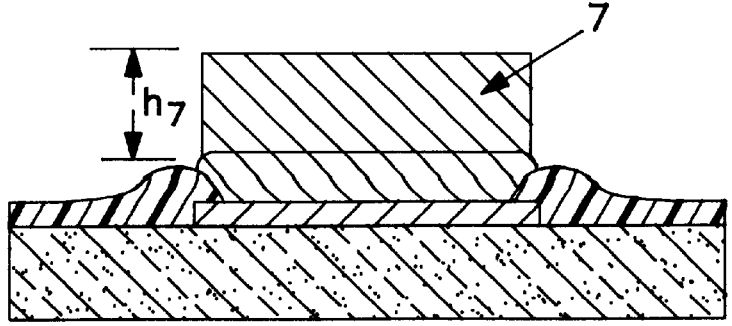

The two processes described below differ particularly by FIGS. 1c and 2c, in which firstly (process A) there is no application of a catalytic polymer coating 8, but said passivation 2 and said metallization 4 are coated directly with said plating base 5, and in which secondly (process B) said metallization 4 is coated with a suitable polymer layer 8 prior to being removed on a large area in order to form an even surface consisting of small separated metallic areas 4a and a large polymeric area 8a in the intermediate space.

Process Flow A (FIG. 1)

1) Chemical deposition 4 of nickel or gold on said aluminum bond pads 1 to provide an under-bump-metallization (nickel thickness approx. 0.5–10 $\mu$m, gold immersion approx. 0.2 $\mu$m). The height of said deposition 4 is approximately the same as the height of said curvature 2a of said passivation 2.

2) Chemical metal deposition of a plating base 5 by activating passivation 2 (chemical gold or nickel or copper or palladium). An electroless nickel deposition and its characteristics is disclosed in Lee, et al., Structures and Corrosion characteristics of electroless Ni—Mo—P-Alloy deposits, Plating and Surface Finish, 1991, September, pages 82ff.

3) Application of photosensitive resist 6 (form and thickness $h_6$ corresponding to the desired form and height $h_7$ of the bump).

4) Preparing an opening 6a into said photosensitive resist 6.

5) Galvanic metal deposition (e.g. Pb, Sn, Au, In) for the formation of a bump 7 in given height and lateral dimension.

6) Stripping of photosensitive resist 6 outside of bumps 7.

7) Outside etching of plating base 5.

Process Flow B (FIG. 2)

1) Chemical deposition 4 of nickel or gold on said aluminum bond pads 1 to provide an under-bump-metallization (nickel thickness approx. 0.5–10 $\mu$m, gold immersion approx. 0.2 $\mu$m), slightly overlapping passivation 2 which surrounds said bond pads 1.

2) Application of a photo-structurable polymer coating 8 (e. g. photosensitive resist):
   a) with catalytic effect;
   b) with subsequent activation (e. g. palladium activator).

3) opening of said polymer coating 8, which is located on top of said under-bump-metallization 4, in order to open or uncover a window 4a into said metallization or removal of a part of the surface area in order to obtain an even surface of said metallization 4a and said polymer coating 8a.

4) Chemical metal deposition of a plating base 5 (chemical gold or nickel or copper or palladium) which is thin with respect to said metallization 4.

5) Application of a thick photosensitive resist 6 (lateral form and thickness $h_6$ corresponding to the desired bump-form and bump-height $h_7$ respectively).

6) Opening said photosensitive resist 6 to form window 6a on top of said aluminum bond pad 1.

7) Galvanic metal deposition (e.g. Pb, Sn, Au, In) to form a galvanic metal bump 7 in said window 6a.

8) Stripping said photosensitive resist 6 outside of said galvanic bumps 7.

9) Etching of said plating base 5 outside of said galvanic bumps 7.

10) Stripping of said polymer coating 8.

Both processes may be used to achieve bumps 7 of galvanic nature in a cost effective and stable manner at reasonable process time. No underbump-diffusion may take place although a cheap chemical deposition of one or two layers underneath said galvanic main part of the bump has been selected, generally so far regarded not to be able to substitute galvanically deposited thin plating layers with respect to sufficient physical necessities.

What claimed is:

1. Method for the preparation of at least one bump structure on a surface of a substrate for bonding purposes, comprising the steps of (a) providing a metallic bond pad on said substrate, said metallic bond pad having a first thickness;

(b) providing a metallic underbump metallization comprising:
      (i) selectively applying a first metallic layer having a second thickness onto only said metallic bond pad by a first electroless deposition, providing an adhesion and diffusion barrier with respect to said bond pad inside said at least one bump structure;
      (ii) providing a passivation outside of said at least one metallic bond pad, covering the surface of the substrate, a surface of said passivation being activated prior to the application of a plating base by a second electroless deposition onto said activated passivation substantially throughout the whole activated surface of said passivation and said selectively applied first metallic layer, said plating base having a third thickness;

(c) providing a photosensitive resist layer, having a fourth thickness, related to a predetermined height of said at least one bump structure;

(d) providing at least one opening in said photosensitive resist layer at a position said at least one metallic bond pad is provided on the substrate;

(e) electrodepositing a metal into said at least one opening, to control the growth of an upper bump portion said at least one bump structure and thus form and shape an electrodeposited upper bump portion onto said electroless deposited underbump metallization and provide said at least one bump structure.

2. Method according to claim 1, in which said third thickness is related to the predetermined height of said at least one bump structure, whereby said photosensitive resist is selected to be insubstantially higher than said predetermined height of said at least one bump.

3. Method according to claim 1, the substrate being a printed circuit board, comprising several conductive paths to form a connector for chips bonded down to said board.

4. Method according to claim 1, said at least one bond pad being made of aluminum.

5. Method according to claim 1, said first electroless depositions being one of a nickel and gold deposition.

6. Method according to claim 1, the second electroless deposition providing said plating base being one of a gold, nickel, copper and palladium deposition.

7. Method according to claim 1, the electrodeposition being a galvanic deposition, applying a potential between a galvanic bath and one of said at least one bond pad, first metallic layer and plating base.

8. Method according to claim 7, the galvanic deposition comprising one of Pb, Sn, Au and In deposition.

9. Method according to claim 1, the third thickness being thinner than one of the first and second thicknesses.

10. Method according to claim 1, the formation of said plating base providing a substantially even surface throughout the surface of the passivation.

11. Method according to claim 1, wherein the metal forming said plating base is selected to permanently avoid the occurring of any substantial diffusion between said underbump metallization and said galvanic upper bump portion.

12. Method according to claim 1, wherein the plating base is covered by a photosensitive resist and said at least one bump structure at least partially covers said plating base, thereby defining a first portion of the plating base which is covered by said bump structure and a second portion of the plating base, which is not covered by said bump structure and wherein the second portion of the plating base is removed after removal of the photosensitive resist, provided for shaping and forming said at least one bump structure.

13. Method according to claim 1, wherein said photosensitive resist layer with said at least one opening for shaping and forming said at least one bump structure is removed after having electrodeposited said metal for shaping and forming said at least one bump.

14. Method according to claim 1, wherein prior to the application of said plating base a photo-sensitive polymer coating is applied onto said passivation outside said electroless deposited first metallic layer and to said metallic layer, further comprising the steps of removing said polymer coating to such an extent that at least said metallic layer is revealed, to obtain a substantially even surface of the metallic layer and said polymer coating;

wide and evenly coating the entire surface of said polymer and metallic layer by applying said plating base onto said metallic layer and said polymer coating.

\* \* \* \* \*

UNITED STATES PATENT AND TRADEMARK OFFICE
CERTIFICATE OF CORRECTION

PATENT NO. : 5,989,993
DATED : November 23, 1999
INVENTOR(S) : Zakel et al.

It is certified that error appears in the above-identified patent and that said Letters Patent is hereby corrected as shown below:

ON THE TITLE PAGE:

Item [30] Foreign Application Priority Data delete "Feb. 12, 1996" and insert therefor --Feb. 9, 1996--.

Signed and Sealed this

Twenty-third Day of January, 2001

Attest:

Attesting Officer

Q. TODD DICKINSON

Commissioner of Patents and Trademarks